United States Patent [19]

Weaver

[11] Patent Number: 4,614,294

[45] Date of Patent: Sep. 30, 1986

[54] APPARATUS FOR HOLDING A PART IN A WAVE SOLDERING MACHINE

[75] Inventor: Charles A. Weaver, Findlay, Ohio

[73] Assignee: RCA Corporation, Princeton, N.J.

[21] Appl. No.: 792,473

[22] Filed: Oct. 29, 1985

[51] Int. Cl.⁴ .............................................. B23K 1/08
[52] U.S. Cl. ..................................... 228/37; 118/500; 118/503; 228/57
[58] Field of Search ................... 118/500, 503; 228/57, 228/39; 279/903

[56] References Cited

U.S. PATENT DOCUMENTS

| | | | |
|---|---|---|---|
| 2,935,962 | 8/1957 | Deitrick et al. | |
| 3,713,876 | 1/1973 | Lavric | 228/19 |
| 4,342,915 | 3/1982 | Wachs | 228/39 |
| 4,421,265 | 12/1983 | Boyer et al. | 228/57 |
| 4,489,923 | 12/1984 | Barresi | 269/8 |
| 4,526,129 | 7/1985 | Braden | 118/503 |

FOREIGN PATENT DOCUMENTS 1102528  3/1961  Fed. Rep. of Germany ........ 228/39

Primary Examiner—Nicholas P. Godici
Assistant Examiner—Karen Skillman
Attorney, Agent, or Firm—Birgit E. Morris; Donald S. Cohen; James M. Trygg

[57] ABSTRACT

An apparatus for holding an IC device for tinning the leads in a wave soldering machine is disclosed. The apparatus utilizes a pair of beveled surfaces, one on each side of the lead to be tinned, to limit the extent of penetration of the lead into the molten solder. The beveled surfaces are made of a material which cannot be wet by the molten solder, therefore, surface tension of the solder will tend to limit penetration of the molten solder into the area defined by the beveled surfaces.

13 Claims, 9 Drawing Figures

APPARATUS FOR HOLDING A PART IN A WAVE SOLDERING MACHINE

This invention relates to the solder tinning of contacts of electronic components in a wave soldering machine and more particularly to such tinning of leads of integrated circuit (IC) devices.

BACKGROUND OF THE INVENTION

It is customary in the industry to pre-tin the leads of ICs during the manufacturing process. This enhances the quality of subsequently formed solder joints at the leads resulting in increased reliability of the final product. One difficulty associated with such tinning operations, however, is in constraining the tinning solder to just the leads. If solder is permitted to contact the body of the IC, excess solder may be retained where the lead exits the body and solder bridges may be formed between leads.

What is needed is a device for holding ICs with respect to the molten solder of a wave soldering machine during tinning of the leads whereby molten solder is prevented from reaching the body of the IC.

SUMMARY OF THE INVENTION

According to the present invention there is provided an apparatus for holding a part to be tinned in a wave soldering machine. The soldering machine contains a quantity of molten solder having a surface, a portion of the surface being displaced upwardly. The apparatus includes a holding means for holding the part in engagement with the molten solder during tinning thereof. The apparatus further includes other means associated with the holding means for inhibiting engagement of a portion of the part with the molten solder.

DESCRIPTION OF THE PREFERRED EMBODIMENT

Figure 1:
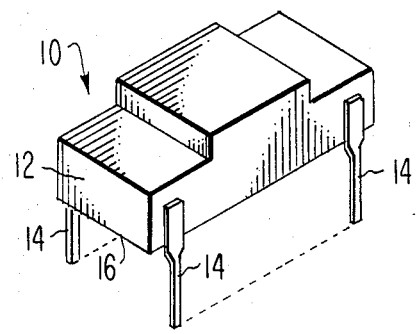
FIG. 1 is an oblique view of a dual-in-line integrated circuit (IC) device of the type to which the present invention is directed.
Figure 2:
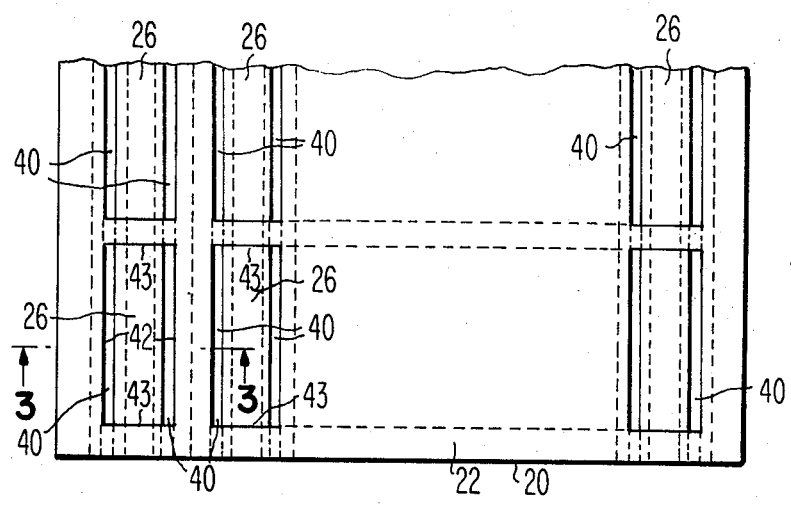
FIG. 2 is a plan view of a holder for holding the IC device of FIG. 1.
Figure 3:
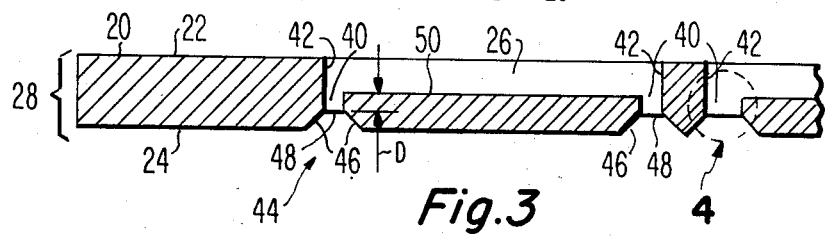
FIG. 3 is a cross-sectional view taken along the lines 3—3 of FIG. 2.
Figure 4:
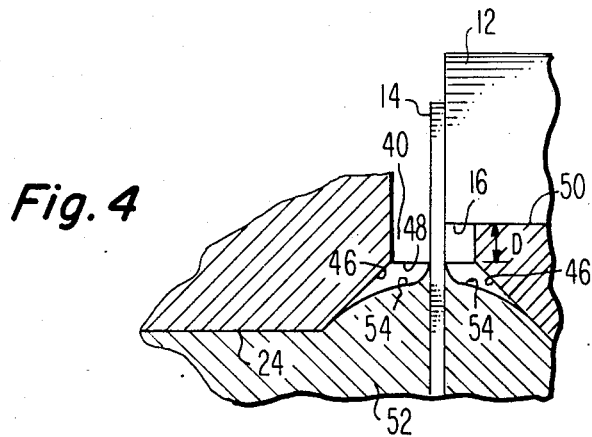
FIG. 4 is an enlarged view of the area indicated by the arrow 4 of FIG. 3, showing details of operation.

There is shown in FIG. 1 a typical dual-in-line integrated circuit (IC) device 10 having a body 12 and metal leads 14. The object of the invention is to tin the leads 14 to within about 0.02 inch (0.5 mm) of the bottom 16 of the device 10. As shown in FIGS. 2, 3, and 4, a base plate 20 is provided having a pair of mutually opposed first and second surfaces 22 and 24 respectively. The first and second surfaces 22 and 24 are major surfaces of the base plate 20 which is of a substantially flat rectangular shape, as best seen in FIGS. 2 and 3. A plurality of rectangularly shaped cavities 26 are formed in the first surface 22. Each cavity 26 includes a pair of longitudinal side walls 42, a pair of end walls 43, and a floor 50. The side walls 42 and end walls 43 are spaced so that the device 10 can be inserted into the cavity 26 with the bottom 16 of the device against the floor 50 of the cavity and the device loosely retained within the cavity. The thickness 28 of the base plate 20 should be sufficient to assure that the plate is relatively rigid when handling and when in operation. However, if the plate is too thick it will be cumbersome to use and will absorb too much heat from the molten solder thereby adversely affecting the tinning operation. By way of example, a titanium base plate having rectangular dimensions of 7 inches (177.8 mm) by 12 inches (304.8 mm) and 45 cavities formed therein may have a thickness of about 0.1 inch (2.54 mm). In this example the 7 inch by 12 inch surfaces would be the first and second surfaces 22 and 24.

A pair of openings 40, in the form of long, narrow slots, are formed through the floor 50 and adjacent the two side walls 42 of each cavity 26. The openings 40 extend the full length of the cavities, as shown in FIGS. 2 and 3. A plurality of V grooves 44, each having a pair of beveled surfaces 46 and a flat bottom 48, are formed in the second surface 24 substantially parallel to the side walls 42, and extend the entire length of the plate 20. The grooves 44 are arranged so that each opening 40 has a groove 44 associated with it whereby the beveled surfaces 46 intersect the openings 40 along their entire lengths as shown in FIGS. 3 and 4. The flat bottom 48 of the groove 44 has a width that is substantially the same as the width of the opening 40, which in the present example is 0.03 inch (0.762 mm). The depth of the groove 44 into the second surface 24 should be controlled so that the dimension D, shown in FIGS. 3 and 4, is about 0.02 inches (0.5 mm). This will position the pair of beveled surfaces 46, which have an included angle of about 90 degrees, so that molten solder will be restrained from entering the opening 40.

FIG. 4 shows an enlarged cross-sectional view of a portion of the base plate 20 to illustrate operation of the apparatus. There, the IC device 12 is shown with its bottom 16 resting on the floor 50 of the cavity 26. The lead 14 of the device 12 projects downwardly through the opening 40 and well below the surface 24. A wave of molten solder 52 is shown in pressing contact with the second surface 24 and in contact with a portion of each beveled surface 46. It will be noted that the molten solder 52 does not wet the surfaces 46 as indicated by the curvature of the upper portion 54 of the solder in FIG. 4. This is a necessary requirement of the present invention, therefore, the base plate 20, or at least the beveled surfaces 40, must be made from a suitable material which is not wetted by the molten solder, such as titanium. In operation, the base plate 20 is driven through the wave of molten solder 52 at a predetermined depth below its surface so that the wave of solder pushes upwardly against the base plate 20 with a specific amount of force in a manner that is well known in the art. A depth is selected that results in a force that causes the molten solder 52 to extend up into the V groove 44 a specific amount, as shown in FIG. 4, without invading the opening 40. It will be appreciated by those skilled in the art, that as the depth is increased, within certain limits, and the base plate 20 forced deeper into the wave so that the molten solder 52 is forced further into the groove 44, the surface tension along the upper portion 54 of the solder 52 will tend to inhibit penetration of the solder into the opening 40. This effectively limits the extent of engagement of the lead 14 with the molten solder 52. Further, this permits substantial leeway in adjusting the depth of the base plate 20 below the wave surface to effect proper operation in accordance with the teachings of the present invention. Prior art devices, on the other hand, require that this depth be very precisely controlled so that molten solder will not contact the device package.

Figure 5:
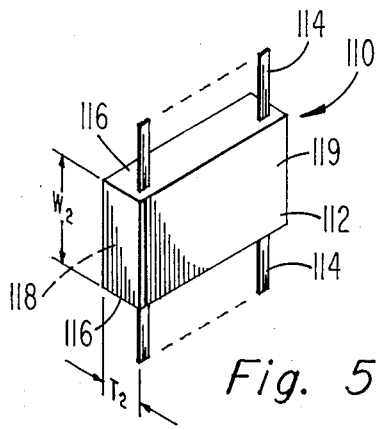
FIG. 5 is an oblique view of an axial lead IC device of the type to which the present invention is directed.
Figure 8:
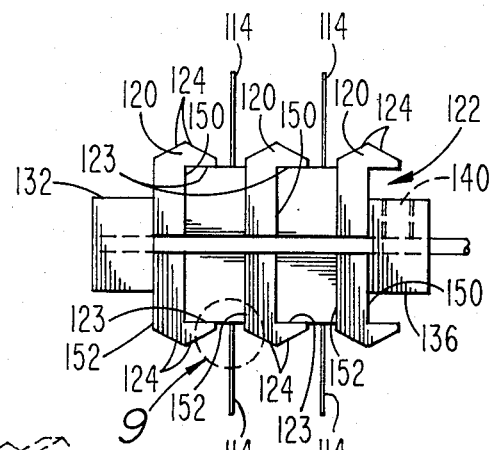
FIG. 8 is an end view of an assembly of the IC devices, holder, and fixture of FIGS. 5, 6, and 7 respectively.
Figure 7:
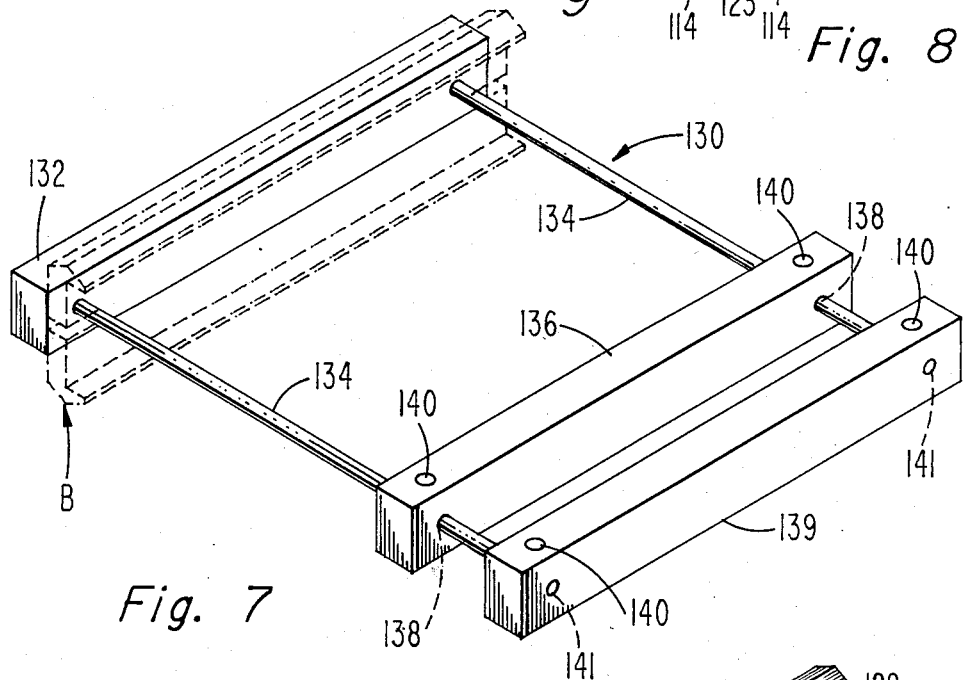
FIG. 7 is an oblique view of a fixture for positioning and clamping a number of the holders of FIG. 6.
Figure 6:
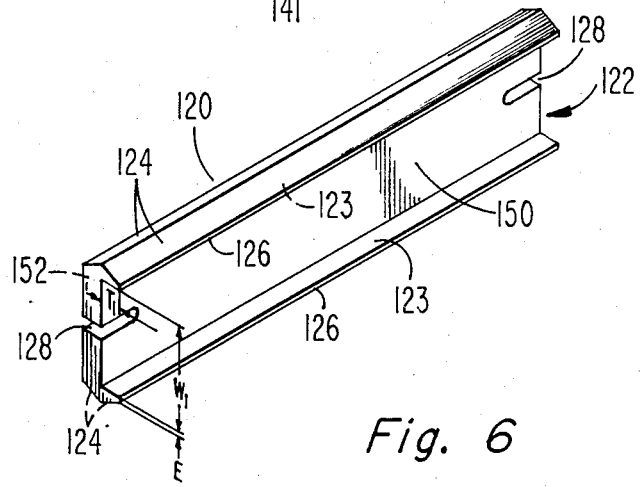
FIG. 6 is an oblique view of a holder for holding the IC device of FIG. 5.

Another embodiment of the present invention which is designed for axial lead components, is shown in FIGS. 6, 7, and 8. FIG. 5 illustrates a typical axial lead IC device 100 having a body 112 and two rows of leads 114. The device 110 includes a pair of mutually opposed surfaces 116 from which the leads 114 project and another pair of mutually opposed surfaces 118 and 119 which are substantially parallel to the plane containing the leads 114.

FIGS. 6 and 8 show a base plate 120, made of titanium, which is somewhat elongted and has a longitudinally formed channel or recess 122 formed throughout its entire length. The recess 122 has a pair of side walls 123 which define a width $W_1$, as best seen in FIG. 6. The width $W_1$ is slightly greater than the width $W_2$ of the IC device 110 of FIG. 5. Further, the depth $T_1$ of the recess 122 is less than the thickness $T_2$ of the IC device 110. The base plate 120 has two pairs of beveled surfaces 124, one pair of beveled surfaces being formed along each edge of the plate 120 for its entire length, as shown in FIG. 6. The beveled surfaces 124 are arranged so that a pair of lands 126 are formed whereby one land is on each side of the recess 122 between a beveled surface 124 and a side wall 123. Each land 126 has a width, indicated by E in FIG. 6, of about 0.02 inch (0.5 mm). A pair of open ended slots 128 are formed, one in each end of the base plate 120 for a purpose which will be explained below. The base plate 120 has a back wall 152 which is substantially flat.

A clamping fixture 130, shown in FIG. 7, includes a back bar 132 and a pair of rods 134 which are rigidly attached to the back bar, one at each end as shown. The rods 134 extend outwardly at right angles to the back bar 132 and are arranged substantially parallel. A clamping bar 136 of rectangular shape has a pair of through holes 138 which are sized and spaced so that the clamping bar can be guided by and slid along the rods 134. A pair of set screws 140 are arranged in threaded holes in the bar 136 so that the set screws may be tightened against the rods 134, thereby locking the clamping bar in any desired position along the rods. An end rail 139 of rectangular shape, similar to the clamping bar 136, has a pair of holes 141 sized and spaced so that the end rail may slide over the ends of the rods 134 as shown in FIG. 7. The holes 141 may be formed through the rail 139, as shown, or may be blind holes formed only part way through. A pair of set screws 140 are arranged in threaded holes in the rail 139 for locking the rail in position at the end of the rods 134 opposite the back 132. The purpose of the rail 139 is to provide, in conjunction with the back bar 132, suitable surfaces by which the clamping fixture 130 may be held in the wave soldering machine. The open ended slots 128 of the base plate 120 are spaced apart a specific distance with respect to the rods 134 so that the base plate 120 may be assembled to the clamping fixture 130 with its back wall 152 firmly against the back bar 132 as shown in phantom lines and indicated at B in FIG. 7. The rods 134 have a diameter that is slightly less than the width of the open ended slots 128 so that they may pass through the open ended slots at each end of the base plate 120 thereby loosely retaining the base plate between the rods 134 within the clamping fixture 130.

In operation, a first base plate 120 is placed in the clamping fixture 130 as set forth above. Several IC devices 110 are then inserted in the recess 122 and arranged end to end to form a row of ICs with their surfaces 118 in engagement with the wall 150 of the base plate and the leads 114 extending across both lands 126. A second base plate 120 is then placed in the clamping fixture 130 so that its backwall 152 is firmly against the surfaces 119 of the IC devices 110 thereby sandwiching the ICs between the two base plates as shown in FIG. 8. A second row of ICs is similarly inserted into the recess 122 of the second base plate 120 and a third base plate placed in the clamping fixture 130. This loading process continues until all ICs are inserted or the capacity of the clamping fixture 130 is reached. Then, a final base plate 120 is placed in the clamping fixture 130 and the clamping bar 136 slid along the rods 134 until it engages the wall 150 of the last base plate 120. The end rail 139 is slipped over the ends of the rods 134 and the set screws 140 of both the clamping bar and the end rail are then tightened thereby locking the complete assembly together as shown in FIG. 8. Each land 126 of the base plate 120 forms, with the back surface of the adjacent base plate 120, an opening through which the leads 114 extend and which is the equivalent of the opening 40 in the base plate 20. The opposed beveled surfaces 124 of adjacent base plates 120 form a V groove that is equivalent to the V groove 44 of the base plate 20.

Figure 9:
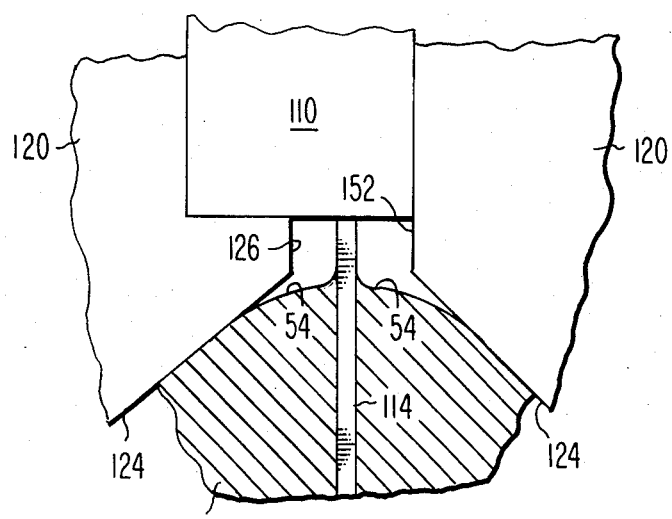
FIG. 9 is an enlarged view of the area indicated by the arrow 9 of FIG. 8, showing details of operation.

As with the base plate 20, the assembly of base plates 120 is driven through the wave of molten solder 52 at a predetermined depth below the surface so that the wave of solder pushes upwardly against the base plates 120 with a specific amount of force. The depth is selected to cause the molten solder 52 to extend up into the area defined by the surfaces 124, as shown in FIG. 9, without invading the area between the land 126 of base plate 120 and the back wall 152 of the adjacent base plate. As explained previously for the base plate 20, as the depth of the base plate 120 below the surface is increased and the molten solder is forced further into the area defined by the surfaces 124, the surface tension along the upper portion 54 of the solder 52 will tend to inhibit penetration of the solder into the area between the land 126 and the back wall 152. This effectively limits the extent of engagement of the lead 114 with the molten solder 52.

An important feature of both embodiments of the present invention is that the surface tension inherent in the surface of the solder 52 is utilized to limit the depth of penetration of leads into the solder thereby preventing solder from reaching the body of the IC device while tinning the leads. This novel use of surface tension is effected by means of the pair of beveled surfaces on either side of the lead to be tinned. It is important, of course, that these beveled surfaces be made of a suitable material that is not wettable by the solder 52.

I claim:

1. In a wave soldering machine containing a quantity of molten solder having a surface, a portion of said surface being displaced upwardly, an apparatus for holding a part to be tinned comprising:

(a) holding means for holding said part in engagement with said molten solder during tinning thereof;

(b) other means associated with said holding means for inhibiting engagement of a portion of said part with said molten solder comprising:

(i) an opening through which said portion of said part projects; and (ii) a pair of beveled surfaces, one of which intersects said opening, said surfaces being resistant to wetting by said molten solder and arranged to inhibit invasion of said opening by said solder.

2. The apparatus set forth in claim 1 wherein said holding means comprises:

(a) a base plate having mutually opposed first and second major surfaces; and (b) a cavity formed in said first surface for accepting said part, wherein said opening intersects said cavity.

3. The apparatus set forth in claim 2 wherein said pair of beveled surfaces are formed in said second major surface.

4. The apparatus set forth in claim 3 wherein said cavity has a pair of mutually opposed side walls and a floor wherein each of said pair of side walls extends from said first surface to said floor.

5. The apparatus set forth in claim 4 wherein said opening is elongated having a side which is continuous with one of said side walls of said cavity, said opening extending the entire length of said cavity.

6. The apparatus set forth in claim 5 wherein both of said pair of beveled surfaces intersect said opening.

7. The apparatus set forth in claim 2 wherein said pair of beveled surfaces are formed in third and fourth surfaces adjacent said first major surface.

8. The apparatus set forth in claim 7 wherein said cavity has a pair of mutually opposed side walls and a floor wherein each of said pair of side walls extends from said first surface to said floor.

9. The apparatus set forth in claim 8 wherein said opening is elongated having a side which is a portion of said first surface, said opening extending the entire length of said cavity.

10. The apparatus set forth in claim 9 including fixture means for holding a first and second of said base plates so that said first surface of said first base plate is in alignment with, spaced from, and parallel to said second surface of said second base plate thereby defining said opening therebetween, one of said pair of beveled surfaces of said first base plate and one of said pair of beveled surfaces of said second base plate intersecting said opening.

11. The apparatus set forth in claim 10 wherein said fixture means includes a backing bar having a pair of parallel, spaced apart rods projecting therefrom at right angles thereto.

12. The apparatus set forth in claim 11 wherein said fixture means includes a locking bar arranged to cooperate with said pair of rods to hold said first and second base plates in locking engagement with said backing bar.

13. The apparatus set forth in claim 12 wherein said locking bar has a pair of through holes through which said pair of rods project so that said locking bar is held substantially parallel to said backing bar and including means for removble securing said locking bar to said rods.

* * * * *